US012784821B2

(12) United States Patent
Nien et al.

(10) Patent No.: US 12,784,821 B2
(45) Date of Patent: Nov. 3, 2026

(54) SYSTEMS AND METHODS TO MITIGATE CYCLE TIME DEGRADATION BY NBTI EFFECT ON PDP SRAM

(71) Applicant: Taiwan Semiconductor Manufacturing Company, Ltd., Hsinchu (TW)

(72) Inventors: Yi-Hsin Nien, Hsinchu (TW); Chih-Yu Lin, Hsinchu (TW); Hidehiro Fujiwara, Hsinchu (TW); Yen-Huei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 157 days.

(21) Appl. No.: 18/786,316

(22) Filed: Jul. 26, 2024

(65) Prior Publication Data

US 2026/0031141 A1 Jan. 29, 2026

(51) Int. Cl.
*G11C 11/419* (2006.01)
*G11C 11/412* (2006.01)
*H10B 10/00* (2023.01)

(52) U.S. Cl.
CPC .......... *G11C 11/419* (2013.01); *G11C 11/412* (2013.01); *H10B 10/12* (2023.02)

(58) Field of Classification Search
CPC ...... G11C 11/419; G11C 11/412; H10B 10/12
See application file for complete search history.

(56) References Cited

U.S. PATENT DOCUMENTS 10,643,689 B1 * 5/2020 Ikeda .................... G11C 7/222
2015/0098267 A1 4/2015 Jain et al.
2019/0355397 A1 * 11/2019 Ishizu ................. H10D 86/423

FOREIGN PATENT DOCUMENTS

| | | | |
|---|---|---|---|
| CN | 1811987 | B | 8/2006 |
| CN | 101042931 | B | 9/2007 |
| CN | 104900256 | B | 9/2015 |
| CN | 114078495 | A | 2/2022 |
| TW | 202403732 | A | 1/2024 |

OTHER PUBLICATIONS

Office Action issued in Taiwan Appl. No. 113146675 dated Oct. 27, 2025.

* cited by examiner

*Primary Examiner* — Min Huang
(74) *Attorney, Agent, or Firm* — Foley & Lardner LLP

(57) ABSTRACT

A memory circuit includes a memory array comprising a plurality of memory cells. The memory circuit includes a first pre-charge circuit coupled to at least one access line electrically connected to the plurality of memory cells and configured to be in a first state during a standby mode of the memory array. The memory circuit includes a second pre-charge circuit coupled to the at least one access line and configured to be in a second state during the standby mode.

20 Claims, 7 Drawing Sheets

500

SYSTEMS AND METHODS TO MITIGATE CYCLE TIME DEGRADATION BY NBTI EFFECT ON PDP SRAM

BACKGROUND

Developments in electronic devices, such as computers, portable devices, smart phones, internet of thing (IoT) devices, etc., have prompted increased demands for memory devices. In general, memory devices may be volatile memory devices or non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure should be understood from the following detailed description with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
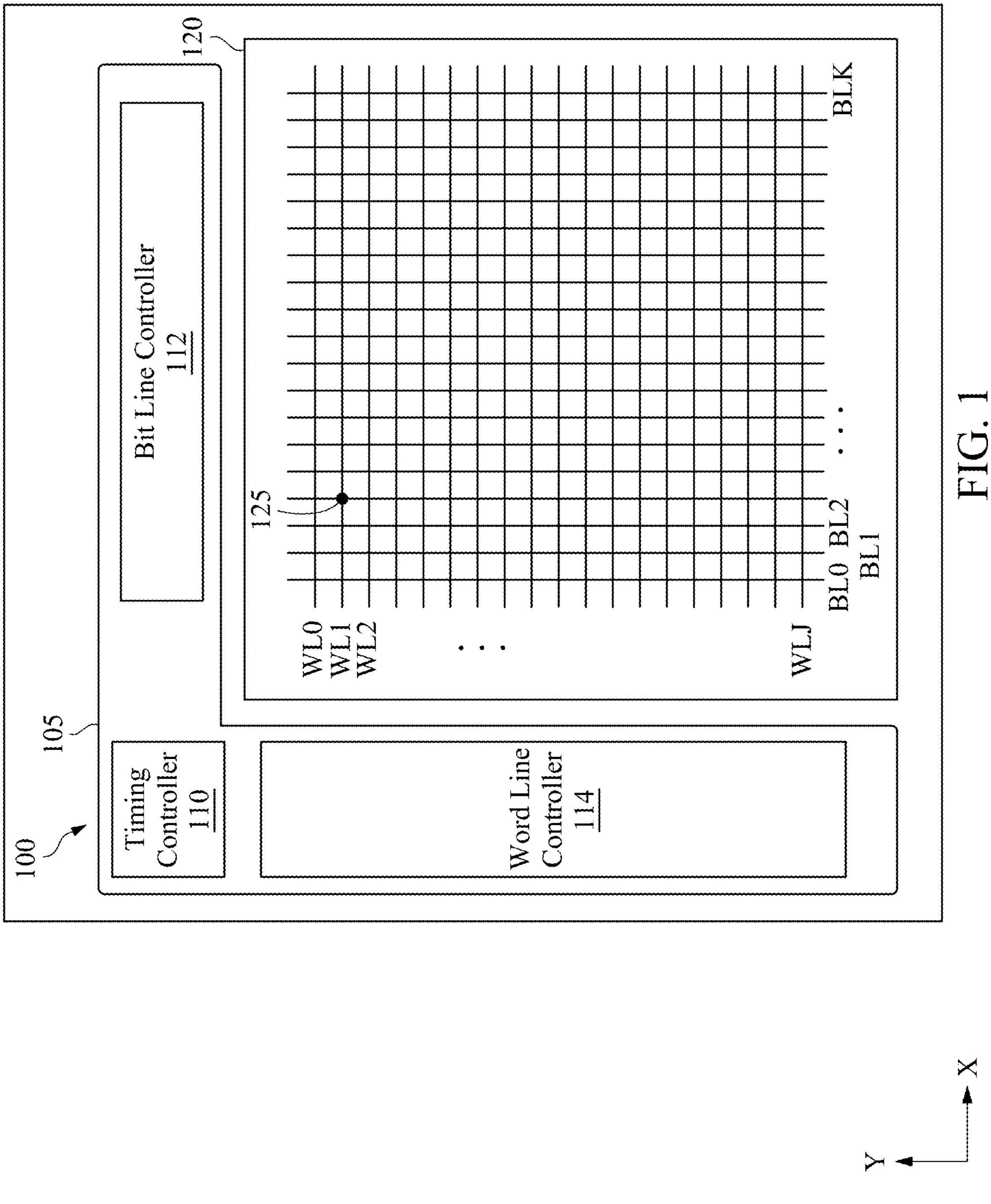
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory circuits or devices can include various components for accessing memory cells within a memory array. These components may include, for example, at least one of address decoders, row and column selectors, sense amplifiers, write drivers, or control logic. The address decoder can interpret memory addresses to select specific rows or columns within the memory array. The row and column selectors can facilitate in addressing of memory cells by directing the selected row and column signals to the desired memory locations, e.g., for reading from or writing to the located memory cells. The sense amplifier can amplify the signals retrieved during read operations to facilitate reading data from the memory cells. The write driver can deliver the data to be stored into the selected memory cells. The control logic can manage the timing and sequencing of memory operations, ensuring accurate data retrieval and storage. Other components can be included as part of the memory device, configured to operate collectively to provide the features or functionalities of the memory device for accessing the memory cells.

In various cases, the integrated circuits may include static random access memory (SRAM) circuits to provide on-chip data storage. An SRAM circuit can be configured to meet specific design requirements associated with the surrounding circuitry attached to the SRAM circuit. One type of SRAM circuit may be configured to provide one port for either read or write access to data stored within the SRAM circuit. The address inputs to such a circuit are typically shared for both read and write access. Another common type of SRAM circuit, referred to as a two-port SRAM circuit, may include a pseudo-dual-port (PDP) SRAM configured to provide two ports for accessing data stored within the SRAM circuit. Two-port SRAM circuits may include a first port for read accesses and a second port for write accesses. The read and write operations of the two-port SRAM circuits can be performed within individual clock cycles, such as a read access and a write access operation within one clock cycle. Each port of the two-port SRAM circuit is typically capable of asynchronous, independent access to data stored within the SRAM circuit, allowing the two-port SRAM circuit to be incorporated into a range of different applications with different usage models.

When using the two-port SRAM circuits, bit line (BL) recovery time can be considered to ensure the proper or desired execution of the read and write operations. For example, in a clock cycle for accessing the memory cells, a bit line (e.g., bit line BL) may be discharged during (or to perform) a read operation, e.g., detecting logic values associated with the memory cells. The bit line can be in a low state (e.g., a low charge state) after the discharge. The discharged bit line may be recharged during a recovery time (e.g., recharge phase) of the bit line, such that a write operation can be performed subsequent to the read operation. Recharging the bit line can bring the bit line to a high state (e.g., a high charge state). In scenarios when the bit line charge is not recovered to a desired level (e.g., a predefined charge or voltage value) when performing a subsequent access operation (e.g., write operation), one or more potential issues may be experienced, including data corruption, read disturbance, write failure, degradation of memory cell, etc. Hence, the bit line recovery time can be considered for delaying a subsequent access operation, e.g., delaying the write operation after the read operation for individual clock cycles of the two-port SRAM circuit to ensure the desired bit line recovery.

The bit line recovery time can be predetermined or set during or after fabricating the memory device or the semiconductor device, for example. The bit line recovery time in the read-to-write procedure can contribute or be a factor in the PDP SRAM cycle time. However, because of a negative bias temperature instability (NBTI) effect, the bit line recovery time may be relatively longer than expected. NBTI can involve the trapping of positive charges in the gate oxide of the transistor under the influence of the negative bias voltage and elevated temperature. The trapped charges may alter the electrical characteristics of the transistor, causing the threshold voltage to shift (e.g., voltage threshold shift (vts)) negatively. Over time, the shift in the threshold voltage can become relatively large and affect the functionality and reliability of the circuit. For instance, when the NBTI occur, the PMOS voltage threshold (VT) can increase according to the following formula:

$$I_{D_{sat}} = \frac{W}{2L}\mu_n C_{ox}(V_{GS}V_T)^2.$$

For example, pre-charge circuits can be structured using a plurality of transistors, such as p-channel metal-oxide semiconductor (PMOS) transistors. Using PMOS transistors, the pre-charge circuits can be activated when the gate is in a low state (e.g., no voltage is applied) and deactivated when the gate is in a high state (e.g., applied with a predefined voltage). However, when the gate of the PMOS transistor is in a low state for an extended duration, the NBTI effect on the PMOS may be exacerbated. NBTI may occur when a negative bias voltage is applied to the gate of the transistor while the device (e.g., memory device) operates at relatively high or elevated temperatures, thereby leading to the trapping of positive charges in the gate oxide, and gradually increasing the voltage threshold (Vt) of the transistor over time. The increase in the voltage threshold (VT) (e.g., sometimes referred to as threshold voltage shift) of the transistor can lead to a degradation of the transistor. For instance, in a PMOS transistor, the threshold voltage is the gate voltage at which the transistor begins to conduct. When the gate of a PMOS transistor is held at a low voltage (e.g., zero volts) for an extended duration, charges can accumulate at the gate oxide interface due to mechanisms like trapped charges or interface states. This accumulation of charges can effectively increase the threshold voltage of the transistor, and as a result (when the PMOS gate is held low for a long time), the threshold voltage of the transistor may be shifted towards relatively higher voltage levels, resulting in a relatively weak PMOS. Having a weak PMOS in the pre-charge circuit can extend the bit line recovery time in the read-to-write procedure, which degrades the PDP SRAM cycle time (e.g., a relatively longer bit line recovery time leads to a relatively longer clock cycle).

The systems and methods of the technical solution can provide various embodiments or configurations of a memory device for mitigating the cycle time degradation by NBTI effect on the PDP SRAM, among other types of SRAM circuits. In some configurations, the systems and methods can provide multiple pre-charge circuits for purposes of pre-charging one or more bit lines. For example, the systems and methods can provide a memory device or circuit including a first pre-charge circuit and a second pre-charge circuit. The pre-charge circuits can be performed using PMOS transistors. The first pre-charge circuit can be activated during a standby mode/state (e.g., access operation is suspended or when not performing the read and write operations) to pre-charge the bit lines. The second pre-charge circuit may be deactivated during the standby mode.

In certain scenarios when the memory circuit is in the standby mode (or phase) for an extended duration, the PMOS transistors associated with the first pre-charge circuit may incur relatively high NBTI impact, e.g., gates of the PMOS transistors are in a low state to activate the pre-charge circuit. With the second pre-charge circuit, the gates of the PMOS associated with the second pre-charge circuit can be in a high state during the standby mode, thereby incurring relatively minimal or low NBTI impact (e.g., no cycle time impact). With this configuration, the second pre-charge circuit can facilitate the bit line recovery, minimizing the time interval between the read-to-write procedures and the clock cycle duration. Although the read-to-write procedures are performed in the clock cycles for the access operations described herein, it should be noted that other types of operations, such as a write-to-read procedure may performed, not limited to the read-to-write procedure.

In some configurations, the systems and methods can provide a pre-charge circuit and an equalizer circuit to mitigate the cycle time degradation by NBTI effect on the PDP SRAM. For example, the memory device can include a pre-charge circuit and an equalizer circuit. The pre-charge circuit can be configured to pre-charge the bit lines during the standby mode. The equalizer circuit can be deactivated during the standby, with the gate of the transistor associated with the equalizer circuit being in a high state (e.g., predefined voltage applied). In such cases, the PMOS transistor associated with the equalizer circuit may experience relatively low or no NBTI impact during the extended standby phase of the memory array. Hence, between the read and write operations, the equalizer circuit can be activated to ensure minimal bit line recovery time by equalizing the discharged bit line (e.g., bit line in the low state) voltage to a voltage level of charged bit line, e.g., pulling the bit line voltage level to another bit line, such as bit line bar (BLB) voltage level.

The systems and methods of the technical solution discussed herein can implement other configurations not limited to those discussed herein or add additional pre-charge circuits and/or equalizer circuits to perform the features or operations for mitigating the cycle time degradation by NBTI effect on PDP SRAM. It should be noted that, although PMOS is used as an example transistor for the pre-charge circuits, other types of transistors not limited to PMOS can be utilized as part of the memory circuits or devices described herein.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one configuration, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. In some embodiments, the timing controller 110 is embodied as or includes a processor and a non-transitory computer readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112 and the word line controller 114. In one approach, to write data at a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

Figure 2:
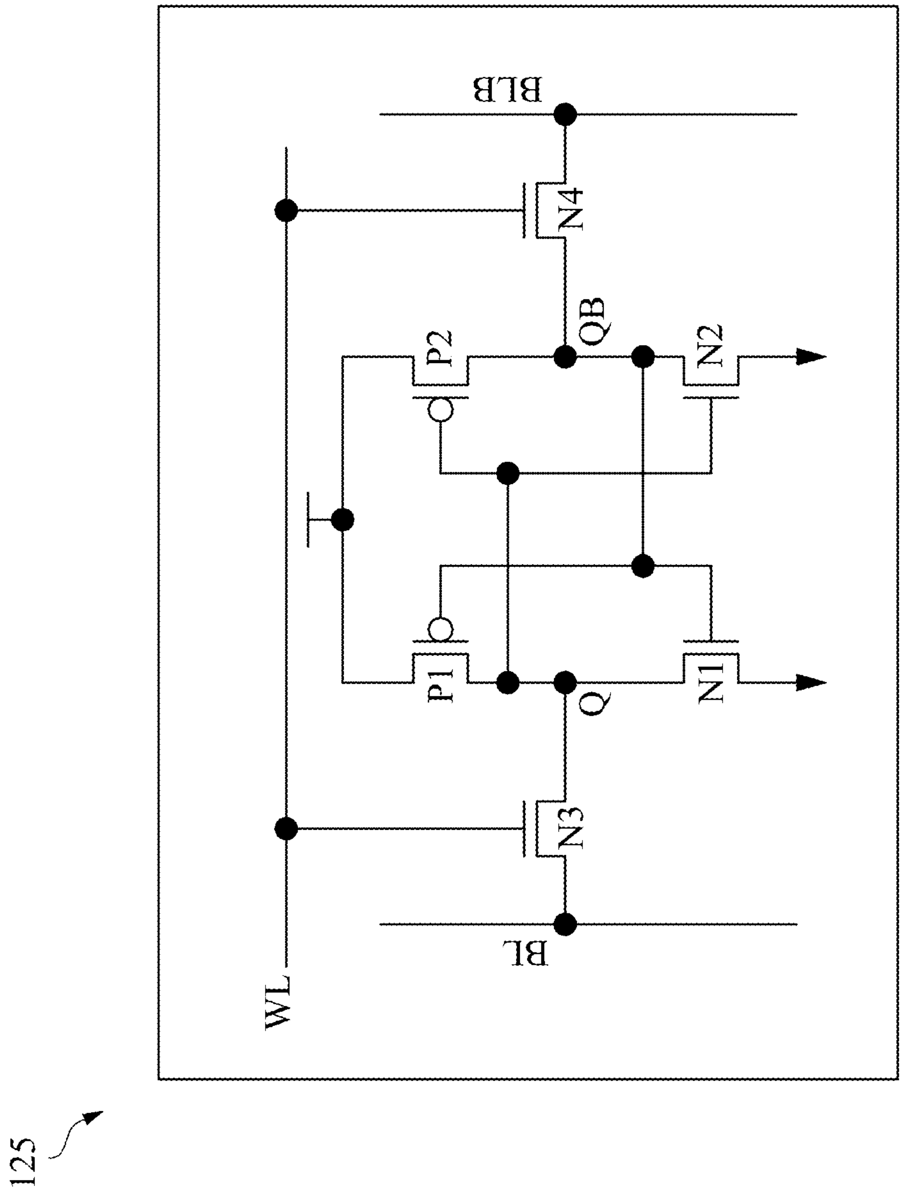
FIG. 2 illustrates a schematic diagram of an example static random access memory (SRAM) cell in the memory device of FIG. 1, in accordance with various embodiments.

FIG. 2 is a schematic diagram of an example SRAM cell 125, in accordance with one embodiment. The SRAM cell 125 can be a PDP six-transistor (6T) SRAM, configured to read and write in individual cycles. Although a PDP 6T SRAM is used as an example, other types of SRAM cells may be provided or utilized to perform the features, functionalities, or operations discussed herein. In some embodiments, the SRAM cell 125 includes N-type transistors N1, N2, N3, N4 and P-type transistors P1, P2. The N-type transistors N1, N2, N3, N4 may be N-type metal-oxide-semiconductor field-effect transistors (MOSFET) or N-type fin field-effect transistors (FinFET). The P-type transistors P1, P2 may be P-type MOSFET or P-type FinFET. These components may operate together to store a bit. In other embodiments, the SRAM cell 125 includes more, fewer, or different components than shown in FIG. 2.

In some configurations, the N-type transistors N3, N4 include gate electrodes coupled to a word line WL. In some configurations, a drain electrode of the N-type transistor N3 is coupled to a bit line BL, and a source electrode of the N-type transistor N3 is coupled to a port Q. In some configurations, a drain electrode of the N-type transistor N4 is coupled to a bit line BLB, and a source electrode of the N-type transistor N4 is coupled to a port QB. In certain aspects, the N-type transistors N3, N4 operate as electrical switches. The N-type transistors N3, N4 may allow the bit line BL to electrically couple to or decouple from the port Q and allow the bit line BLB to electrically couple to or decouple from the port QB, according to a voltage applied to the word line WL. For example, according to a supply voltage VDD (or 1V) corresponding to a high state (or logic value '1') applied to the word line WL, the N-type transistor N3 is enabled to electrically couple the bit line BL to the port Q and the N-type transistor N4 is enabled to electrically couple the bit line BLB to the port QB. For another example, according to a ground voltage VSS (or 0V) corresponding to a low state (or logic value '0') applied to the word line WL, the N-type transistor N3 is disabled to electrically decouple the bit line BL from the port Q and the N-type transistor N4 is disabled to electrically decouple the bit line BLB from the port QB.

In some configurations, the N-type transistor N1 includes a source electrode coupled to a first supply voltage rail supplying the ground voltage VSS or 0V, a gate electrode coupled to the gate electrode of the P-type transistor P1, and a drain electrode coupled to the port Q. In some configurations, the P-type transistor P1 includes a source electrode coupled to a second supply voltage rail supplying the supply voltage VDD, a gate electrode coupled to the gate electrode of N-type transistor N1, and a drain electrode coupled to the port Q. In some configurations, the N-type transistor N2 includes a source electrode coupled to the first supply voltage rail supplying the ground voltage VSS or 0V, a gate electrode coupled to the port Q, and a drain electrode coupled to the port QB. In some configurations, the P-type transistor P2 includes a source electrode coupled to the second supply voltage rail supplying the supply voltage VDD, a gate electrode coupled to the port Q, and a drain electrode coupled to the port QB. In such configurations, the N-type transistor N1 and the P-type transistor P1 operate as an inverter, and the N-type transistor N2 and the P-type transistor P2 operate as an inverter, such that two inverters form cross-coupled inverters. In one aspect, the cross-coupled inverters may sense and amplify a difference in voltages at the ports Q, QB. When writing data, the cross-coupled inverters may sense voltages at the ports Q, QB provided through the N-type transistors N3, N4 and amplify a difference in voltages at the bit lines BL, BLB. For example, the cross-coupled inverters sense a voltage 0.5 V at the port Q and a voltage 0.4V at the port QB, and amplify a difference in the voltages at the ports Q, QB through a positive feedback (or a regenerative feedback) such that the voltage at the port Q becomes the supply voltage VDD (e.g., 1V) and the voltage at the port QB becomes the ground voltage VSS (e.g. 0V). The amplified voltages at the ports Q, QB may be provided to the bit lines BL, BLB through the N-type transistors N3, N4, respectively for reading.

Figure 3:
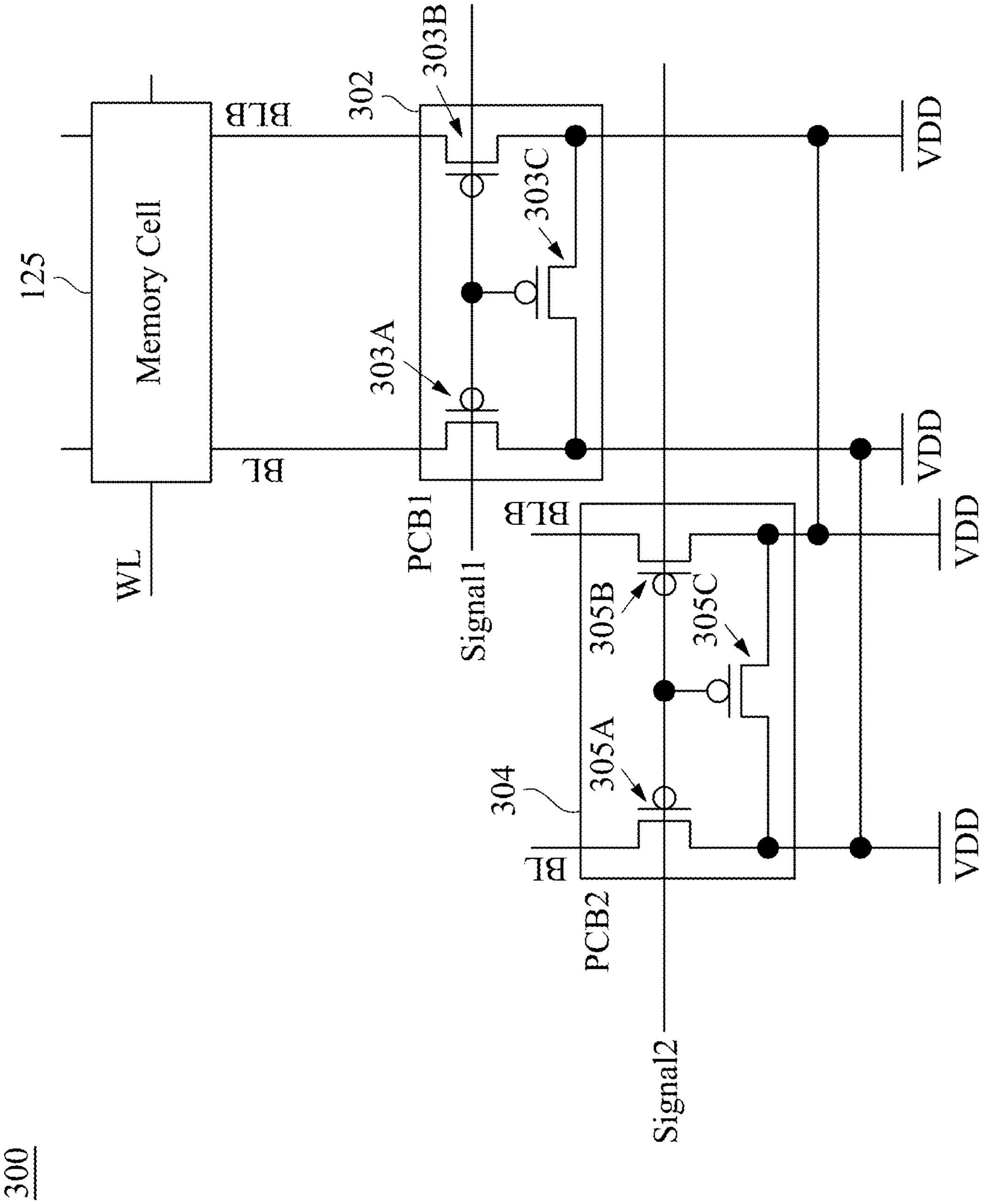
FIG. 3 illustrates a schematic diagram of multiple pre-charge circuits used for the memory device of FIG. 1, in accordance with various embodiments.

FIG. 3 illustrates a schematic diagram 300 of multiple pre-charge circuits used for the memory device 100 of FIG. 1, in accordance with various embodiments. The schematic diagram 300 of FIG. 3 shows an example of using multiple pre-charge circuits for mitigating cycle time degradation by NBTI effect on the memory cell 125 (e.g., PDP SRAM). The components or circuits of the schematic diagram 300 can be a part of the memory device 100. As shown, the schematic diagram 300 includes pre-charge circuits 302, 304, e.g., sometimes referred to as a first pre-charge circuit 302 and a second pre-charge circuit 304. The pre-charge circuits 302, 304 can be operatively and electrically coupled to the bit lines (e.g., bit lines BL and BLB) to (pre-) charge the bit lines BL and BLB for accessing the memory cell 125. In this case, the first pre-charge circuit 302 can be labeled as a first printed circuit board (PCB) (e.g., PCB1) and the second pre-charge circuit 304 can be labeled as a second PCB (e.g., PCB2). For purposes of providing examples herein, the pre-charge circuits 302, 304 can be described as charging the bit line BL, although the pre-charge circuits 302, 304 may charge other bit lines, such as but not limited to the bit line BLB or bit lines for other memory cells of the memory array 120 described in conjunction with FIG. 1.

Each of the pre-charge circuits 302, 304, can include a plurality of transistors 303A-C, 305A-C. The transistors 303A-C can sometimes be referred to as transistor(s) 303 or switch(es) 303. The transistors 305A-C can sometimes be referred to as transistor(s) 305 or switch(es) 305. The transistors 303, 305 may operate as switches. A control line can be operatively coupled to the gates (e.g., gate electrodes) of the transistors 303, 305 for controlling or operating the transistors 303, 305. Operating the transistors 303, 305 can refer to activating or deactivating the transistors 303, 305 by supplying voltage at the gate electrodes or not supplying voltage to the gate electrodes (e.g., keeping the gate electrodes at zero voltage). The control line can carry control signals (e.g., labeled as "Signal1" or "Signal2") to the gate electrodes of the transistors 303, 305.

The transistors 303, 305 of the pre-charge circuits 302, 304 can be PMOS transistors. Although the transistors 303, 305 are described as PMOS transistors herein, it should be noted that other types of transistors such as NMOS, bipolar junction transistor (BJT), junction field-effect transistor (JFET), etc., can be implemented or utilized as part of at least one of the pre-charge circuits 302, 304, not limited to PMOS transistors. The transistors 303A-C can be referred to as first to third transistors of the first pre-charge circuit 302, respectively. The transistors 305A-C can be referred to as fourth to sixth transistors of the second pre-charge circuit 304, respectively.

Each of the transistors 303, 305 can include a first source/drain (S/D) electrode, a second S/D electrode, and the gate electrode. The gate electrodes of the transistors 303A-C can be electrically coupled to each other, and in connection with a first control line to receive a control signal (e.g., "Signal1"). The gate electrodes of the transistors 305A-C can be electrically coupled to each other, and in connection with a second control line to receive a control signal (e.g., "Signal2").

The first S/D electrodes of transistors 303A, 305A can be electrically coupled to the bit line BL (e.g., the same bit line BL). The bit line BL may be referred to as a first bit line or a first access line. The second S/D electrodes of the transistors 303A, 305A can be electrically coupled to a supply voltage or a voltage source (e.g., VDD). Further, the second S/D electrodes of the transistors 303A, 305A can be electrically coupled to each other. The first S/D electrodes of transistors 303B, 305B can be electrically coupled to the bit line BLB (e.g., the same bit line BLB). The bit line BLB may be referred to as a second bit line or a second access line. The second S/D electrodes of the transistors 303B, 305B can be electrically coupled to a supply voltage or a voltage source (e.g., VDD). Further, the second S/D electrodes of the transistors 303B, 305B can be electrically coupled to each other.

The first S/D electrodes of the transistors 303C, 305C can be electrically coupled to the second S/D electrodes of the transistors 303A, 305A, or the supply voltage, respectively. The second S/D electrodes of the transistors 303C, 305C can be electrically coupled to the second S/D electrodes of the transistors 303B, 305B, or the supply voltage, respectively. For purposes of providing examples, each of the pre-charge circuits 302, 304 can include three transistors. Depending on the design and implementation of the pre-charge circuits 302, 304, the pre-charge circuit 302, 304 may include more or fewer transistors, not limited to three transistors.

To activate or turn on the transistors 303, 305 (e.g., PMOS transistors), no voltage (e.g., 0 V) may be applied or signaled to the gate electrodes of the transistors 303, 305. Further, to deactivate or turn off the transistors 303, 305, a predefined voltage (e.g., 1V) may be applied to the gate electrodes of the transistors 303, 305. The predefined voltage or no voltage may be applied to the gate electrodes of the transistors 303, 305 via the respective control lines. For example, the memory controller 105 can send a first signal (e.g., "Signal1") for activating or deactivating the first pre-charge circuit 302 and a second signal (e.g., "Signal2") for activating or deactivating the second pre-charge circuit 304 via the respective control lines, e.g., shown in at least FIGS. 3-4. The control line of the first pre-charge circuit 302 can carry the first signal including a high voltage level or low voltage level to the gate electrodes of the transistors 303 for operating the transistors 303. The control line of the second pre-charge circuit 304 can carry the second signal including a high voltage level or low voltage level to the gate electrodes of the transistors 305 for operating the transistors 305. The high voltage level can be a predefined voltage value, such as 1 V, 3 V, etc. The low voltage level can be a predefined voltage value, such as 0 V, for example. For purposes of providing examples herein, the transistors 303, 305 (e.g., PMOS transistors) can be activated by applying the low voltage to the gate electrodes and deactivated by applying high voltage to the gate electrodes.

Activating or deactivating the transistors 303, 305 can correspond to activating or deactivating the first pre-charge circuit 302 or the second pre-charge circuit 304, respectively. Activating the pre-charge circuits 302, 304 may sometimes be referred to as setting or configuring the pre-charge circuits 302, 304 to a low state or a first state. The low voltage level can be signaled to the pre-charge circuits 302, 304 in the low state. After activating the transistors 303A-B, 305A-B, a conduction path can be established between the supply voltage (e.g., VDD) and the respective bit lines, allowing current flows to the respective lines for charging. For example, activating the transistors 303A or 305A allows for the charging of bit line BL. In another example, activating the transistors 303B or 305B allows for the charging of bit line BLB.

Deactivating the pre-charge circuits 302, 304 may sometimes be referred to as setting or configuring the pre-charge circuits 302, 304 to a high state or a second state. The high voltage level can be signaled to the pre-charge circuits 302, 304 in the high state. After deactivating the transistors 303A-B, 305A-B, the conduction path between the respective bit lines and the supply voltage to be disconnected, suspending or preventing the (pre-) charging of the bit lines. The respective bit lines can be discharged subsequent to the deactivation of the pre-charge circuits 302, 304. For example, deactivating the transistors 303A or 305A suspends or disables the charging of the bit line BL. In another example, deactivating the transistors 303B or 305B suspends or disables the charging of the bit line BLB.

Each of the pre-charge circuits 302, 304 can include a respective equalizer. In some cases, the equalizer may be a circuit or other components configured to selectively couple the BL and BLB. For purposes of providing examples herein, the equalizer is implemented as the transistors 303C and 305C, as described in conjunction with FIG. 3, although the equalizer may be implemented as one or more switches or one or more transistors. For example, the equalizer for the first pre-charge circuit 302 can correspond to the transistor 303C. The equalizer for the second pre-charge circuit 304 can correspond to the transistor 305C. The transistors 303C, 305C (e.g., the equalizer) can be configured to equalize the voltage between the bit lines BL and BLB. Equalizing the voltage between the bit lines BL and BLB can include or refer to adjusting the voltage levels of one bit line to be the same as another, such as bring the voltage level of the bit line BL up to the voltage level of the bit line BLB, such as described in conjunction with at least FIG. 4. The adjustment can occur by transferring the charge between the bit lines, such as charging the bit line BL by transferring the charge from the bit line BLB. In such cases, if one bit line has a higher voltage (e.g., representing a logic '1'), the charge can be transferred to the other bit line until both bit lines reach the same voltage level or until both bit lines reach the high state representing logic '1'.

For purposes of providing examples herein, activating at least one of the pre-charge circuits 302, 304 can allow at least one of the transistors 303C, 305C, respectively, to equalize the charge or voltage of the bit lines BL and BLB to the high voltage level. In some implementations, the equalizer can be replaced by a different component that can perform the functions of the equalizer described herein. In various configurations, the equalizer can be controlled according to the signal communicated via the control line of the respective pre-charge circuits 302, 304.

For example, the equalizer may be activated/enabled to electrically couple the bit line BL to the bit line BLB, in response to the first voltage (e.g., VDD or 1V) applied at the gate electrode of the transistor 303C via the signal "Signal1". In another example, the equalizer may be disabled to electrically decouple the bit line BL from the bit line BLB, in response to receiving the second voltage (e.g., VSS or 0V) or having the second voltage applied to the gate electrode of the transistor 303C (or lack of voltage thereof). A similar operation can be performed for the second pre-charge circuit 304 (e.g., with the transistor 305C). In such cases, by coupling the bit line BL and bit line BLB, the voltages between the bit line BL and bit line BLB can be equalized to prevent, for instance, potential functional errors during the read or write operation of the memory device 100. In some configurations, such as described in conjunction with FIG. 4, the voltages between the bit line BL and the bit line BLB can be equalized to facilitate the charging of one bit line with charges from another bit line, e.g., charging of the bit line BL, in part, by transferring or receiving the charge from the bit line BLB.

To perform the read or write operation, the pre-charge circuits 302, 304 can be deactivated. Deactivating the pre-charge circuits 302, 304 can include deactivating the transistors 303, 305, respectively, to prevent the pre-charging of the bit lines BL and BLB. In such cases, the signals "Signal1" and "Signal2" can include the second voltage (e.g., VSS or 0V) applied to the gate electrodes of the transistors 303, 305. The second voltage applied to the gate electrode of the transistors 303C and 305C can decouple the bit lines BL and BLB. The second voltage applied to the gate electrodes of the transistors 303A-B and 305A-B can disable current flow between the source and drain. Accordingly, the pre-charge circuits 302, 304 can terminate or suspend pre-charging the bit lines BL and BLB, so that the read or write operation can be properly performed via the bit lines BL and BLB, including but not limited to carrying signals from the memory cell 125 (or other memory cells) to the memory controller 105, among other circuits, or carrying the data signals to store in the memory cell 125 (or other memory cells).

Prior to accessing the memory cell 125 to perform the read and write operation, the at least one of the pre-charge circuits 302, 304 can be activated to pre-charge the bit lines BL and BLB to the supply voltage. For purposes of providing examples, and as described in conjunction with FIGS. 4 and 5, the pre-charge circuit 302 can be activated prior to the access operation. A time period (or clock cycles) when the access operation is suspended or not performed can be associated with a standby mode of the memory array 120 or the memory device 100. In certain scenarios, the memory array 120 may be in the standby mode for an extended duration, e.g., prolonging the duration at which the gate electrodes of a transistor are in the low state (e.g., first state or zero voltage applied). In such scenarios, the transistor (e.g., PMOS transistors) may experience a relatively high NBTI effect causing an increase in voltage threshold shift and degrading the transistor. A degraded transistor can be referred to as a weak transistor. With the weak transistor and the increase in voltage threshold shift, the bit line recovery time may be increased, thereby extending the duration between the read and write operations (for the read-to-write procedure) and the clock cycle time to perform the read-to-write procedures. Hence, a second pre-charge circuit 304 can be implemented to lower, minimize, or mitigate the NBTI impact on the transistors 303 of the first pre-charge circuit 302, for example.

In various configurations, during the standby mode when the access operation is suspended (e.g., no read or write operations), the first pre-charge circuit 302 can be in a first state (e.g., a low state) where no voltage is applied to the gate electrodes of the transistors 303. Further, during the standby mode, the second pre-charge circuit 304 can be in a second state (e.g., a high state) where a predefined voltage is applied to the gate electrodes of the transistors 305. In this case, during the standby mode, the first pre-charge circuit

302 is activated and the second pre-charge circuit 304 is deactivated (or inactive). The first pre-charge circuit 302 can charge at least one of the bit line BL and the bit line BLB to the supply voltage (e.g., VDD) prior to accessing the memory cell 125 during the standby mode of the memory array 120. The second pre-charge circuit 304 may not charge the bit lines BL and BLB during the standby mode, with the gate electrodes of the transistors 305 maintained in the high state such that there is minimal or no NBTI impact on the transistors 305.

During a read operation or a write operation (e.g., access operation), the first pre-charge circuit 302 can be configured to the high state (e.g., the second state) by applying the predefined voltage (e.g., high voltage level) to the gate electrodes of the transistors 303. The first pre-charge circuit 302 can be disabled in the second state. The second pre-charge circuit 304 can be maintained in the second state during the read and write operations. During the read operation or the write operation, one of the bit line BL or the bit line BLB can be discharged to a lower state (e.g., relatively low voltage level, representing logic '0'), and the other bit line can be maintained in the higher state (e.g., relatively high voltage level, representing logic '1').

Between the read and write operations, the first pre-charge circuit 302 and the second pre-charge circuit 304 can be configured or switched to the first state from the second state by applying the high voltage level to the transistors 303, 305. During the time period between the read and write operations, the first pre-charge circuit 302 and the second pre-charge circuit 304 can charge the bit lines BL and BLB to the supply voltage. In scenarios when one or more of the transistors 303 of the first pre-charge circuit 302 are impacted by the NBTI, the second pre-charge circuit 304 can facilitate charging the bit lines BL and BLB to minimize the bit line recovery time, mitigating the cycle time degradation.

After the read and write operations, the memory array 120 can enter the standby mode until a subsequence access operation, e.g., the next clock cycle to perform the read-to-write procedure. For instance, after completing the write operation, the first pre-charge circuit 302 can be configured to the first state to pre-charge the bit lines BL and BLB, and the second pre-charge circuit 304 can remain in the second state. The operations discussed herein can be reiterated or repeated for various access operations/procedures. By using the second pre-charge circuit 304 with the relatively lower voltage threshold compared to the first pre-charge circuit 302 (because the transistors 305 are maintained in the high state during the standby mode), the NBTI impact of the first pre-charge circuit 302 can be minimized or mitigated.

In some implementations, the first pre-charge circuit 302 and the second pre-charge circuit 304 can be connected in parallel. In such cases, the second S/D electrodes of the transistors 305A-B can be electrically coupled to the second S/D electrodes of the transistors 303A-B. Further, the first S/D electrodes of the transistors 305A-B can be electrically coupled to the first S/D electrodes of the transistors 303A-B, which are electrically coupled to the bit lines BL and BLB, respectively.

Figure 4:
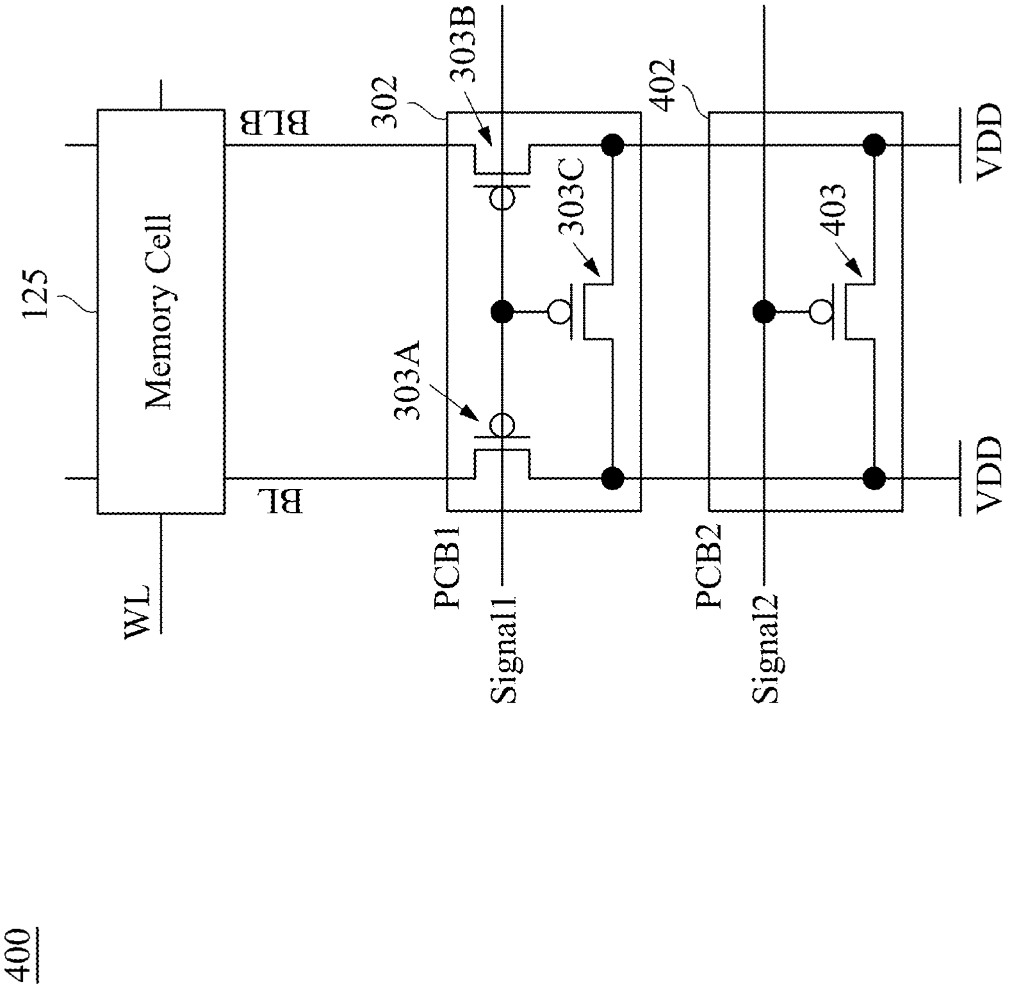
FIG. 4 illustrates a schematic diagram of a pre-charge circuit and an equalizer circuit used for the memory device of FIG. 1, in accordance with various embodiments.

FIG. 4 illustrates a schematic diagram 400 of the pre-charge circuit 302 and an equalizer circuit 402 used for the memory device 100 of FIG. 1, in accordance with various embodiments. In some implementations, to minimize or mitigate the NBTI effect of the transistors 303 in the first pre-charge circuit 302 (e.g., sometimes referred to generally as pre-charge circuit 302 herein), an equalizer circuit 402 can be implemented in series connection to the pre-charge circuit 302. The equalizer circuit 402 can be utilized instead of the second pre-charge circuit 304. As shown, the schematic diagram 400 includes at least the memory cell 125, the pre-charge circuit 302, such as described in conjunction with at least FIG. 3, and the equalizer circuit 402. In this case, the pre-charge circuit 302 can be labeled as PCB1 and the equalizer circuit 402 can be labeled as PCB2.

The equalizer circuit 402 can include a transistor 403 operating as an equalizer. The transistor 403 can include a gate electrode, a first S/D electrode, and a second S/D electrode. The gate electrode can be electrically coupled to a control line to receive a signal (e.g., "Signal2"), similar to the signal for the second pre-charge circuit 304. The first S/D electrode of the transistor 403 can be electrically coupled to the supply voltage (e.g., VDD), the second S/D electrode of the transistor 303A, and/or the first S/D electrode of the transistor 303C. The second S/D electrode of the transistor 403 can be electrically coupled to the supply voltage, the second S/D electrode of the transistor 303B, and/or the second S/D electrode of the transistor 303C.

For example, when a high voltage level is applied to the gate electrode of the transistor 403 via the respective control line, the equalizer circuit 402 can be deactivated, e.g., decoupling the bit lines BL and BLB. When a low voltage level (e.g., zero voltage) is applied to the gate electrode of the transistor 403, the equalizer circuit 402 can be activated, thereby equalizing the charges of the bit lines BL and BLB. In various implementations, the equalizer circuit 402 can equalize the bit lines BL and BLB by transferring charge from the bit line BLB to the bit line BL, for instance, to mitigate or lower the NBTI impact of the degraded transistors, minimize the bit line recovery time, and avoid erroneous read or write operations.

The operations of the pre-charge circuit 302 and the equalizer circuit 402 can be similar to the operations of the pre-charge circuits 302, 304, such as described in conjunction with at least FIG. 3. For example, during the standby mode, the pre-charge circuit 302 can be configured in the first state (e.g., low state), where the gate electrodes of the transistors 303 are in the low state (e.g., no voltage or low voltage level is applied). The pre-charge circuit 302 can be activated in the first state to charge the bit lines BL and BLB to the supply voltage during the standby mode prior to accessing the memory cell 125 to perform the read or write operation. The equalizer circuit 402 can be in the second state (e.g., high state) during the standby mode, similar to the second pre-charge circuit 304, by applying the high voltage (e.g., 1 V) to the gate electrode of the transistor 403. In the second state, the equalizer circuit 402 can be deactivated.

In a clock cycle to access the memory cell 125, a read-to-write operation can be performed, for example. During the read operation (e.g., first access operation), the pre-charge circuit 302 can be set or configured to the high state for deactivation by applying the high voltage level to the gate electrodes of the transistors 303. The equalizer circuit 402 can be maintained in the high state, e.g., remain deactivated. The bit line BL can be discharged to a lower state (e.g., discharged to the low voltage level, representing logic '0') during the read operation, while the bit line BLB can remain in the high state (e.g., high voltage level, representing logic '1'). It should be noted that the discharging of the bit line BL during the read operation is used as an example, and other bit lines (e.g., bit line BLB) may be discharged instead in a certain access operation (e.g., read operation or write operation), not limited to the read operation.

Subsequent to the read operation, where the bit line BL is discharged to the lower state, a time period/duration can be predefined for bit line recovery, e.g., recovering the charge or voltage level of the bit line BL. In some cases, the time period between the read and write operations may be referred to as a predefined recovery time, a time gap, or a recharge time. During this time period, the pre-charge circuit 302 and the equalizer 402 can be activated by applying the low voltage (e.g., representing logic '0') to the transistors 303, 403. By activating the equalizer circuit 402, the charge from the bit line BLB (e.g., in the high state) can be transferred to the bit line BL, thereby increasing or pulling up the lower state of the bit line BL voltage to the bit line BLB voltage, for example. The equalizer circuit 402 can operate with the pre-charge circuit 302 to equalize and charge the bit lines BL and BLB. Operating the equalizer circuit 402 with the pre-charge circuit 302 can mitigate the potential NBTI effect of the transistors 303 of the pre-charge circuit 302, e.g., after a prolonged standby mode when no voltage is applied to the gate electrodes of the transistors 303.

The write operation (e.g., second access operation) is performed after the predefined bit line recovery time. The pre-charge circuit 302 and the equalizer circuit 402 can be deactivated to perform the write operation, similar to the read operation. After completing the read-to-write procedure, the pre-charge circuit 302 can be activated to pre-charge the bit lines BL and BLB in prior to subsequence access operations.

In some implementations, multiple pre-charge circuits 302, 304 can be implemented for pre-charging the bit lines BL and BLB to improve the performance of the memory device 100 by reducing individual clock cycle time and mitigating the NBTI effect of one of the pre-charge circuits 302, 304, for example. In some other implementations, the pre-charge circuit 302 and the equalizer circuit 402 can be implemented for pre-charging the bit lines BL and BLB to improve the performance of the memory device 100 while minimizing the area usage of the components. An example timing for setting at least one of but not limited to the word line WL, the bit lines BL and BLB, the pre-charge circuit 302, the pre-charge circuit 304, or the equalizer 402 to the first state or the second state can be described in conjunction with at least FIG. 5.

Figure 5:
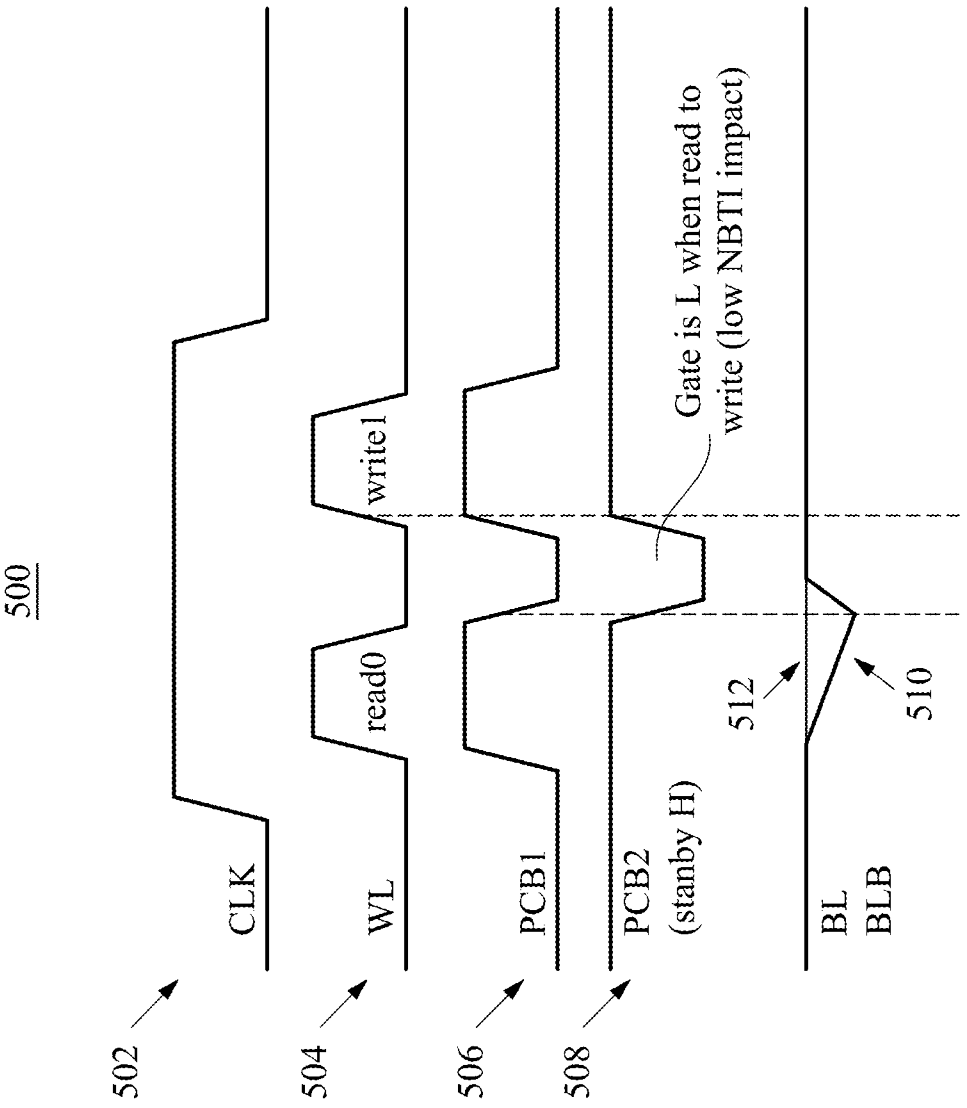
FIG. 5 illustrates an example timing diagram for operating components of the memory device of at least one of FIGS. 1-4, in accordance with various embodiments.

FIG. 5 illustrates an example timing diagram 500 for operating components of the memory device 100 of at least one of FIGS. 1-4, in accordance with various embodiments. The components of the memory device 100 can include or refer to at least one of the word line WL, the bit line BL, the bit line BLB, the first pre-charge circuit 302, the second pre-charge circuit 304, the equalizer circuit 402, etc. The timing diagram 500 for the operation of the components can be described in conjunction with at least one of but not limited to FIGS. 1-4.

The timing diagram 500 shows lines 502-512, representing the state of certain components of the memory device 100. For example, line 502 can represent the state of the clock cycle. Line 504 can represent the state of the word line WL. Line 506 can represent the state of PCB1 (e.g., the pre-charge circuit 302) or the voltage level applied to the gate electrodes of the transistors 303. Line 508 can represent the state of the PCB2 (e.g., the second pre-charge circuit 304 or the equalizer circuit 402) or the voltage level applied to the gate electrodes of the transistors 305 or the transistor 403. The second pre-charge circuit 304 can operate similarly to the equalizer circuit 402 for purposes of pre-charging the bit line BL (or bit line BLB, in some cases) and mitigating the NBTI effect. Line 510 can represent the state of the bit line BL. Line 512 can represent the state of the bit line BLB.

In various implementations, the read and write operations (e.g., read-to-write procedure) can be performed in one clock cycle, as shown in lines 502, 504 of FIG. 5. The word line WL can be in the high state to perform the read operation and the write operation. For example, the word line controller 114 can apply a voltage or current to the memory cell 125 through the word line WL coupled to the memory cell 125. By applying the voltage or current via the word line WL, the word line WL can be in the high state (e.g., predefined voltage level applied) during the access operations.

As shown in lines 506 and 508, the PCB1 (e.g., the first pre-charge circuit 302) can be set to the low state (or the first state) and the PCB2 (e.g., the second pre-charge circuit 304 or the equalizer 402) can be set to the high state (or the second state) during the standby mode/state when access operations are suspended or terminated. At the standby mode, the PCB1 can be activated to pre-charge the bit lines BL and BLB, as shown in lines 510, 512. To perform the read operation, the PCB1 can be deactivated or set to the high state prior to or at a time instance when the read operation is initiated. During the read operation, the bit line BL can be discharged to a low state (or low voltage level), as shown in line 510. The other bit line, e.g., bit line BLB, can remain in the high state (or high voltage level). Although the bit line BL is discharged in this example, it should be noted that the bit line BLB may be discharged while the bit line BL is maintained in the high state, in some cases.

After completing the read operation, the PCB1 and the PCB2 can be set to the low state, activating the functions of the PCB1 and PCB2. For example, the PCB1 can start pre-charging the bit lines BL and/or BLB. The PCB2 can facilitate the pre-charging of the bit line BL and/or BLB by charging the bit lines BL and/or BLB to the supply voltage or equalizing the voltage level of the bit line BL to the bit line BLB. By using the PCB1 and PCB2, the NBTI effect can be minimized and the cycle time degradation can be mitigated. As shown in FIG. 5, the bit line BL can be charged to the high state prior to the start of the subsequent access operation (e.g., the write operation, in this case).

Subsequent to the predefined time duration or period for bit line recovery, the PCB1 and PCB2 can be set to the high state to perform the write operation, thereby deactivating the PCB1 and PCB2. The PCB1 and PCB2 can be deactivated prior to or at the time instance when the write operation is initiated (e.g., the word line WL set to the high state). After completing the write operation, the PCB1 can be set to the low state to continue pre-charging the bit lines BL and BLB for subsequent access operations. The PCB2 can be maintained in the high state, e.g., remain deactivated until the next read-to-write procedure, for example. Because the transistors 305 or the transistor 403 are maintained at the high voltage level, there may be minimal or no NBTI effect on the transistors 305 or 402 (e.g., PMOS transistors).

Various time durations or periods described herein can be predefined, predetermined, or pre-configured after fabricating the memory device 100. For example, the duration of each clock cycle can be predefined. The duration of the read or write operation, e.g., setting the word line to the high state or applying voltage or current to the word line to perform the access operation, can be predefined. The duration of the PCB1 in the high state can be predefined, which may be associated with the duration of the respective access operation. The duration of the PCB1 and PCB2 in the low state (e.g., bit line recovery time) can be predefined. The start time and end time of at least one of the access operation, the switching of the high state and the low state for the PCB1 and/or the PCB2, etc., can be predefined, for example. In some implementations, one or more time durations or instances can be modified or configured according to the specification or configuration of the memory device 100, for example.

In some implementations, the PCB2 (e.g., the second pre-charge circuit 304 or the equalizer circuit 402) or the transistors 305 or 403 associated with the PCB2 can be configured with a relatively lower voltage threshold (compared to the PCB1). Reducing the voltage threshold of the PCB2 can further minimize the potential NBTI impact, for example.

Figure 6:
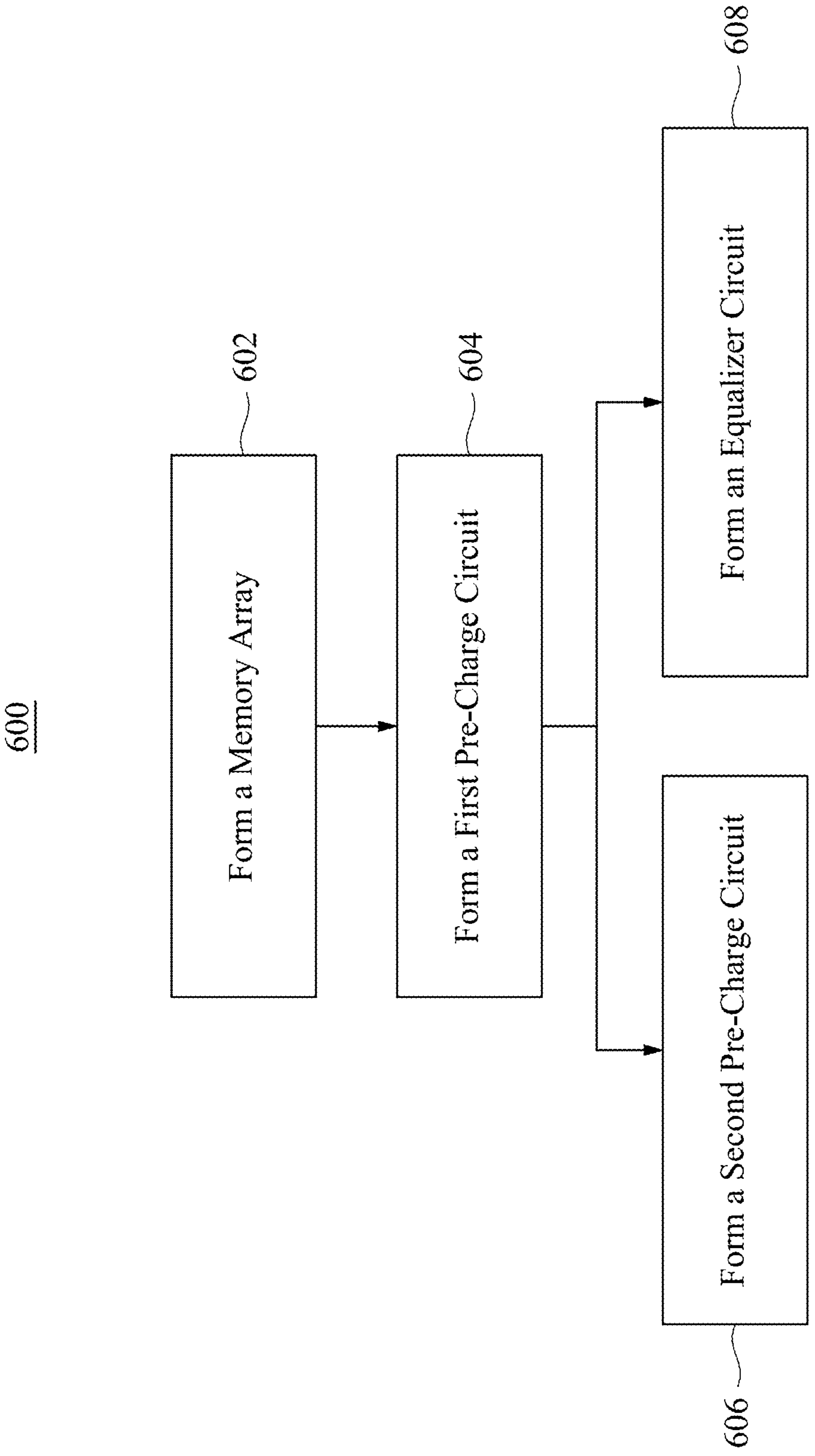
FIG. 6 illustrates a flow of an example method for forming the memory device of at least one of FIGS. 1-4, in accordance with some embodiments.

FIG. 6 illustrates a flow of an example method 600 for forming the memory device (e.g., 100) of at least one of FIGS. 1-4, in accordance with some embodiments. The method 600 can be performed to form any of memory devices herein or a portion thereof. For example, the method 600 can be performed to form any of the memory devices or a component thereof discussed with respect to FIGS. 1-4. For example, at least one of operations of the method 600 may be performed to form a memory device (e.g., 100). Accordingly, the following discussion of the method 600 may refer to some of the reference numerals used in FIGS. 1-4 as a non-limiting example. Further, the method 600 is merely an example, and is not intended to limit the present disclosure. It should thus be understood that additional operations may be provided before, during, and after the method 600 of FIG. 6, and that some other operations may only be briefly described herein. The method 600 can be performed simultaneously and/or in any order other than the order depicted in FIG. 6.

The method 600 can start with operation 602 of forming a memory array (e.g., 120) in an area of a substrate. The substrate may be a wafer, such as a silicon wafer, or a silicon-on-insulator (SOI) substrate. In some cases, an SOI substrate can include a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The memory array includes a plurality of memory cells (e.g., 125). In some examples, each of the memory cells may be implemented as a six-transistor (6T) static random access memory (SRAM) cell (e.g., PDP 6T SRAM) that consists of six transistors (e.g., N1, N2, N3, N4, P1, and P2). However, it should be understood that the first to fourth memory cells may be implemented as other types of SRAM configurations than 6T, e.g., eight transistor (8T) or ten transistor (10T) configurations. In some examples, alternatively or additionally, the memory cells may be implemented as other type of memory cells such as, for example, dynamic random access memory (DRAM) cells, resistive random access memory (RRAM) cells, phase-change random access memory (PCRAM) cells, or magnetoresistive random access memory (MRAM) cells. In various embodiments, the memory cells may be formed along a major (e.g., frontside) surface of the substrate. According to fabrication of these memory cells (and corresponding memory arrays) may sometimes be referred to as front-end-of-line (FEOL) processing.

In some configurations, at least one word line (e.g., word line WL) can be coupled to at least one of the plurality of memory cells. The word line WL can be charged (e.g., voltage or current applied) to a supply voltage or to a predefined voltage level during a read operation or a write operation of the memory cells. For instance, the voltage or current can be applied or supplied to the word line WL for a predefined time periods or durations to perform the read operation or the write operation. In various implementations, the memory cells (e.g., PDP SRAM) can be configured to perform the read and write operations within one clock cycle.

At operation 604, the method 600 can include forming a first pre-charge circuit (e.g., 302). The first pre-charge circuit can include a plurality of transistors, including a first transistor (e.g., 303A), a second transistor (e.g., 303B), and a third transistor (e.g., 303C). The first pre-charge circuit may include more or fewer transistors, not limited to three transistors. The transistors may be PMOS transistors, although other types of transistors may be implemented to perform the features or operations discussed herein. The transistors can operate or function as switches. For example, each transistor can be turned on or off by applying a predefined low voltage (e.g., setting the transistor to a low state) or a predefined high voltage (e.g., setting the transistor to a high state), for example. Turning on or off the transistors of the first pre-charge circuit can correspond to activating or deactivating the first pre-charge circuit, for example. Activating the pre-charge circuit can start the pre-charging of at least one of the access lines.

Each transistor can include a first S/D electrode, a second S/D electrode, and a gate electrode. For example, the first S/D electrode of the first transistor can be electrically coupled to a first access line (e.g., bit line BL), and the second S/D electrode of the first transistor can be coupled to the supply voltage and the first S/D electrode of the third transistor. In further examples, the first S/D electrode of the second transistor can be electrically coupled to a second access line (e.g., bit line BLB), and the second S/D electrode of the second transistor can be coupled to the supply voltage and the second S/D electrode of the third transistor. The first access line and the second access line can be electrically coupled to at least one of the plurality of memory cells (e.g., 125). The gate electrodes of the first to third transistors can be coupled to each other and to a control line (or multiple control lines) configured to send a signal (e.g., high voltage or low voltage).

By applying the high voltage at the gate electrodes, the transistors (e.g. PMOS transistors) can be turned off to suspend the charging of the access lines. By applying the low voltage at the gate electrodes, the transistors can be turned on, allowing the pre-charging of at least one of the access lines to the supply voltage (e.g., predefined voltage level). In such cases, the operations of the transistors (and the activation of the pre-charge circuit) can be based on or according to the voltage applied at the gate electrodes (e.g., gate voltage). According to the connections discussed herein, the first pre-charge circuit can be electrically coupled to the access line electrically connected to the memory cells, for example.

At operation 606, the method 600 can include forming a second pre-charge circuit (e.g., 304). The second pre-charge circuit can include similar components or features as the first pre-charge circuit. In some cases, the second pre-charge circuit may include different components or features from the first pre-charge circuit, such as additional or alternative components (e.g., transistors, switches, or functionalities).

The second pre-charge circuit can be in parallel connection with the first pre-charge circuit, as discussed herein. For purposes of providing examples, the second pre-charge circuit can include components and be structured similarly to the first pre-charge circuit, such as including three transistors and similar interconnection thereof. It should be noted that the second pre-charge circuit may include different components or be structurally different from the first pre-charge circuit, not limited to the exemplary embodiments discussed herein.

For example, the second pre-charge circuit can include a fourth transistor (e.g., 305A), a fifth transistor (e.g., 305B), and a sixth transistor (e.g., 305C). Each of the transistors can include a first S/D electrode, a second S/D electrode, and a gate electrode. The first S/D electrode of the fourth transistor can be electrically coupled to the first access line, and the second S/D electrode of the fourth transistor can be coupled to the supply voltage and the first S/D electrode of the sixth transistor. In further examples, the first S/D electrode of the fifth transistor can be electrically coupled to the second access line, and the second S/D electrode of the fifth transistor can be coupled to the supply voltage and the second S/D electrode of the sixth transistor. The gate electrodes of the fourth to sixth transistors can be coupled to each other and to a control line (or multiple control lines) configured to send a signal (e.g., high voltage or low voltage). The control line associated with the fourth to sixth transistors is different from the control line associated with the first to third transistors configured to send individual signals (e.g., "Signal1" and "Signal2") to the respective pre-charge circuits.

In various implementations, the third transistor of the first pre-charge circuit and the sixth transistor of the second pre-charge circuit can operate as an equalizer to electrically couple the first and second access lines. The equalizer can be configured to equalize the charges of the access lines, such as adjusting the voltage level of one access line to be similar to the voltage level of another access line.

In operation, the first pre-charge circuit can be in a first state during a standby mode of the memory array and the second pre-charge circuit can be in a second state during the standby mode of the memory array. The standby mode can be associated with a time period when an access operation is suspended or no access operation is performed, e.g., the absence of a read operation and a write operation. The first state may be referred to as a low state associated with applying the low voltage to the gate electrodes of the transistors of the respective pre-charge circuit. The second state may be referred to as a high state associated with applying the high voltage to the gate electrodes of the transistors of the respective pre-charge circuit. With PMOS transistors, the first state can be indicative of an active pre-charge circuit to charge the at least one access line to a supply voltage (e.g., VDD). The second state can be indicative of an inactive pre-charge circuit to suspend charging of the at least one access line. In such cases, during the standby mode, the first pre-charge circuit in the first state can be configured to charge the at least one access line to the supply voltage prior to accessing the plurality of memory cells. During the standby mode, the second pre-charge circuit in the second state may not charge the at least one access line, e.g., remain deactivated.

In a particular clock cycle, at least one word line WL coupled to the plurality of memory cells can be charged to a supply voltage or a predefined voltage level during or to perform a read operation and/or a write operation of the plurality of memory cells. The word line WL can be charged to a high state (e.g., high voltage or current level) during the read and write operations (e.g., access operation) for respective predefined first time periods, such as described in conjunction with at least FIG. 5, for example. The time periods of the word line WL in the high state may be the same for read and write operations. In some cases, the time periods of the word line WL in the high state may be different between the read and write operations. The word line WL can be in a low state (e.g., low voltage or current level) during the standby mode or outside of the access operation (e.g., between the read and write operations). The word line WL can be discharged from the high state to the low state when the access operation is suspended.

In various configurations, the first pre-charge circuit can be in or set to the second state to suspend charging the at least one access line during the read operation and the write operation of the plurality of memory cells. When performing the read operation and/or the write operation, the pre-charge circuit can be in an access mode/state (switched from the standby mode), for example. The first pre-charge circuit can be in the second state during the read operation and the write operation for predefined second time periods associated with the respective predefined first time periods. The duration of the predefined second time periods for when the first pre-charge circuit is in the second state can be based on the duration of the predefined first time periods for the read operation and the write operations.

In some cases, the second time periods can be relatively longer than the first time periods, such that the pre-charge circuit can switch to the second state before or at the start of an access operation (e.g., word line WL charged to the high state), or switch to the first state after or at the end of the access operation (e.g., word line WL discharged to the low state). In some other cases, the second time periods may be the same as the first time periods, such that the start and the end time of the access operation, e.g., when the word line WL is charged to the high state or discharged to the low state, are the same as the instances when the pre-charge circuit switches to the second state to perform the access operation, and switches to the first state to suspend the access operation, respectively. The second pre-charge circuit can remain in the second state during the read operation and the write operation, similar to the first pre-charge circuit.

During at least one of the access operations, such as during the read operation of the plurality of memory cells (as part of the read-to-write procedure), the at least one access line may be discharged. The at least one access line can be recharged or recovered during a predefined time period between the access operations, e.g., after the read operation and before the write operation. In this case, the first pre-charge circuit and the second pre-charge circuit can be in the first state during at least a part of the predefined time period between the read operation and the write operation to charge the at least one access line. Setting the first and second pre-charge circuits to the first state activates the pre-charge circuits to charge the at least one access line to the supply voltage. Accordingly, the at least one access line can be recharged after the read operation, when the first pre-charge circuit and the second pre-charge circuit are in the first state. A time period of recharging the at least one access line (or the duration of the pre-charge circuits in the first state) can be predetermined/predefined.

After the at least one access line is recovered, a subsequent access operation (e.g., the write operation) can be performed. Similar to the read operation, the pre-charge circuits can be disabled or deactivated by setting or configuring to the second state, to perform the write operation. In some implementations, the at least one word line WL may be charged to the supply voltage or the predefined voltage level for the write operation at a (same) time instance when the first pre-charge circuit and the second pre-charge circuit are in the second state or switch from the first state to the second state, for example.

At operation 608, the method 600 can include forming an equalizer circuit (e.g., 402). For example, the equalizer circuit can be formed, implemented, or provided additionally or alternatively to the second pre-charge circuit. For purposes of providing examples, herein, the equalizer circuit can be formed alternative to the second pre-charge circuit, such that the plurality of memory cells are coupled to the (first) pre-charge circuit and the equalizer circuit.

The equalizer circuit can include a transistor (e.g., 403). The transistor (e.g., sometimes referred to as a fourth transistor) of the equalizer circuit can be a PMOS transistor. In this case, the fourth transistor can include a first S/D electrode coupled to the supply voltage (e.g., VDD), the first S/D electrode of the third transistor of the pre-charge circuit, and/or the second S/D electrode of the first transistor of the pre-charge circuit. The fourth transistor can include a second S/D electrode coupled to the supply voltage, the second S/D electrode of the third transistor of the pre-charge circuit, and/or the second S/D electrode of the second transistor of the pre-charge circuit. The fourth transistor can include a gate electrode coupled to a control line, different from the control line of the pre-charge circuit.

In some implementations, the equalizer circuit may include more than one transistor of similar or different types, not limited to the PMOS transistor. When activated, the transistor of the equalizer circuit can couple a first access line (e.g. bit line BL) to a second access line (e.g., bit line BLB), e.g., transferring charges from one access line to another, or pulling a relatively lower voltage level of one access line to a relatively higher voltage level of another access line. When deactivated, the transistor of the equalizer circuit can decouple the first access line from the second access line.

The equalizer circuit can be activated or deactivated similar to the second pre-charge circuit, as discussed hereinabove. For example, the low voltage can be applied to the gate electrode of the transistor to activate the equalizer circuit. The high voltage can be applied to the gate electrode of the transistor to deactivate the equalizer circuit. In various implementations, the first pre-charge circuit can operate similarly, for instance, with the equalizer circuit as with the second pre-charge circuit.

In some configurations, the operations of the second pre-charge circuit may be applied similarly to the equalizer circuit. For example, during the standby mode of the memory array when access operations are suspended or no access operation is performed, the pre-charge circuit coupled to the first access line and the second access line electrically connected to the plurality of memory cells can be in the low state, e.g., activated to pre-charge the access lines. The equalizer circuit coupled to the first access line and the second access line can be in the high state during the standby mode, e.g., deactivated.

The high state can be indicative of an inactive pre-charge circuit to suspend charging the first and second access lines or an inactive equalizer circuit to suspend equalizing charges of the first access line and the second access line. The low state can be indicative of an active pre-charge circuit to charge the first and second access lines to the supply voltage or an active equalizer circuit to equalize charges of the first access line and the second access line. In the low state during the standby mode, the pre-charge circuit can (pre-) charge the first access line and the second access line to the supply voltage prior to accessing the plurality of memory cells.

In further examples, in operation, the pre-charge circuit can be in the high state to suspend charging at least one of the first access line or the second access line during the read operation and/or the write operation of the plurality of memory cells. The equalizer circuit can remain in the high state during the read operation and the write operation to suspend equalizing a first charge of the first access line to a second charge of the second access line. The pre-charge circuit and the equalizer circuit can be in the low state at a predefined time period between the read operation and the write operation. For instance, in the low state, the pre-charge circuit can charge the first access line and the second access line to the supply voltage and the equalizer circuit can equalize the first charge of the first access line to the second charge of the second access line, e.g., pull up the voltage level of the first access line to the voltage level of the second access line.

In some configurations, when performing an access operation, such as a read operation, one access line may be discharged while another access line can maintain the charge level. As such, when activating the equalizer circuit, the access line with a relatively higher charge level can transfer or charge the other access line with a relatively lower charge level. After performing the access operations, the memory array can be in standby mode until a subsequent access operation.

In various implementations, the read operation and the write operation of the plurality of memory cells can be performed in one clock cycle. In some implementations, a respective time period/duration of at least one of the read operation, the write operation, the high state of the pre-charge circuit (e.g., during access operations), the low state of the pre-charge circuit and the equalizer circuit between the read operation and the write operation (e.g., during the bit line recovery time), or time gap between the read operation and the write operation may be predefined/predetermined or configured according to the design of the memory device, for example.

In some arrangements, more than two pre-charge circuits can be formed for (pre-) charging one or more access lines. In some arrangements, more than one equalizer circuit may be formed for charging at least one access line. In some configurations, at least one pre-charge circuit (e.g., the second pre-charge circuit) may be connected to multiple pairs of access lines, such as connected to a third access line, a fourth access line associated with other memory cells, etc., for example. In some embodiments, the equalizer circuit may couple at least one of the first access line or the second access line to at least one other access line, e.g., a third access line, a fourth access line, etc., to equalize the charge or voltage of at least one of the first access line or the second access line to the other access line. In some configurations, the transistors discussed herein can include or be other types of transistors, such as N-type transistors, etc., not limited to P-type transistors.

Figure 7:
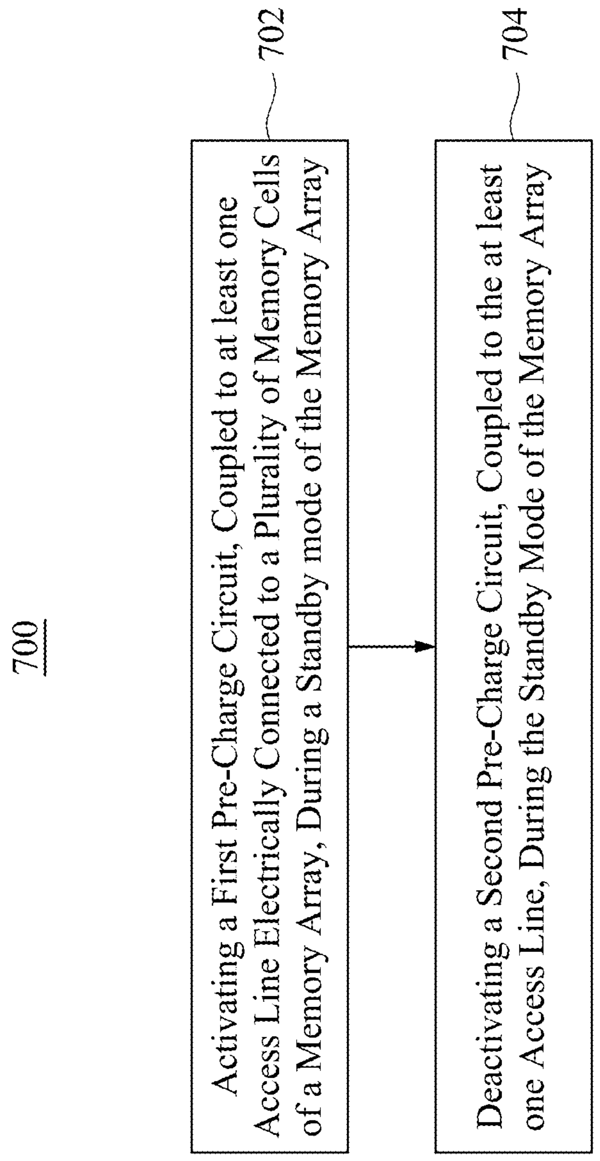
FIG. 7 illustrates a flow of an example method for operating the memory device of at least one of FIGS. 1-4, in accordance with some embodiments.

FIG. 7 illustrates a flow of an example method 700 for operating the memory device (e.g., 100) of at least one of FIGS. 1-4, in accordance with some embodiments. The method 700 can be performed to operate any of memory devices herein or a portion thereof. For example, the method 700 can be performed to operate any of the memory devices or a component thereof discussed with respect to FIGS. 1-4. For example, at least one of operations of the method 700 may be performed to operate a memory device (e.g., 100).

Accordingly, the following discussion of the method 700 may refer to some of the reference numerals used in FIGS. 1-4 as a non-limiting example. Further, the method 700 is merely an example, and is not intended to limit the present disclosure. It should thus be understood that additional operations may be provided before, during, and after the method 700 of FIG. 7, and that some other operations may only be briefly described herein. The method 700 can be performed simultaneously and/or in any order other than the order depicted in FIG. 7. In some cases, one or more operations of the method 700 can include or correspond to one or more operations of at least the method 600 of FIG. 6. In some cases, the method 700 can include one or more operations described in conjunction with at least one of but not limited to FIGS. 3-5.

The method 700 can start with operation 702 of activating a first pre-charge circuit (e.g., 302) during a standby mode of a memory array (e.g., 120). Activating the first pre-charge circuit can refer to configuring or setting the pre-charge circuit in a first state. The first pre-charge circuit can be coupled to at least one access line (e.g., bit line BL or bit line BLB) electrically connected to a plurality of memory cells (e.g., 125) of the memory array. Configuring a pre-charge circuit to a particular state can involve either supplying predefined voltage at gate electrodes or not supplying (or suspending supply of) the voltage to the gate electrodes of the transistors (e.g., 303 or 305) associated with the pre-charge circuit.

For example, the first state can be indicative of an active pre-charge circuit to charge the at least one access line to a supply voltage. To activate the first pre-charge circuit (or configure the first pre-charge circuit to the first state), the method 700 can include suspending the supply of voltage at the gate electrodes of the transistors (e.g., 303) associated with the first pre-charge circuit, e.g., during the standby mode of the memory array. In this case, the transistors of the first pre-charge circuit can be PMOS transistors, such that the at least one access line can be pre-charged by the first pre-charge circuit in the first state.

The method 700 can continue with operation 704 of deactivating a second pre-charge circuit (e.g., 304) during the standby mode of the memory array. Deactivating the pre-charge circuit can refer to or involve configuring or setting the pre-charge circuit in a second state. The second state can be indicative of an inactive pre-charge circuit to suspend charging the at least one access line. For example, to deactivate the second pre-charge circuit (or configure the second pre-charge circuit to the second state), the method 700 can include supplying voltage at the gate electrodes of the transistors (e.g., 305) associated with the second pre-charge circuit, e.g., during the standby mode of the memory array. The transistors of the second pre-charge circuit can be PMOS transistors. In this case, the transistors of the second pre-charge circuit can be deactivated, such that the second pre-charge circuit is suspended from charging the at least one access line during the standby mode of the memory array.

In various implementations, the method 700 can configure (e.g., activate or deactivate) at least one of the first or second pre-charge circuits during (or between) one or more access operations of the memory array. The access operation can include read operation and/or write operation. For example, during the read operation and the write operation of the memory array, the method 700 can deactivate the first pre-charge circuit (or configure the first pre-charge circuit in the second state) to suspend pre-charging the at least one access line. Similarly, the method 700 can deactivate or maintain the deactivation of the second pre-charge circuit (e.g., configure or maintain the second pre-charge circuit in the second state), such that the at least one access line is not pre-charged during the read and/or write operations. The memory array can be in the standby mode after performing the read and write operations in a clock cycle, until the next clock cycle, for example.

During a time period between a read operation and a write operation (e.g., the standby mode between the read and write operations), the method 700 can include activating the first pre-charge circuit and the second pre-charge circuit (e.g., configuring the first pre-charge circuit and the second pre-charge circuit to the first state) to pre-charge the at least one access line by suspending voltage supply to the gate electrodes of the transistors associated with the pre-charge circuits. Because voltage is supplied to the gate electrodes of the transistors of the second pre-charge circuit prior to activating the second pre-charge circuit, the potential NBTI impact (e.g., from the extended standby phase of the memory array) from using the first pre-charge circuit (e.g., in scenarios without the second pre-charge circuit) can be minimized.

In some implementations, the memory device (e.g., 100) can include an equalizer circuit (e.g., 402) additionally or alternatively to the second pre-charge circuit. In this case, the method 700 can include configuring the equalizer circuit in the first state or the second state depending on the operation of the memory array, e.g., activating or deactivating the equalizer circuit, respectively. The operations of the equalizer circuit and a transistor (e.g., 403) associated with the equalizer circuit may be similar to the second pre-charge circuit. For example, during the standby mode of the memory array before or after the read and write operations in a clock cycle, the method 700 can include configuring the equalizer circuit in the second state (e.g., deactivating the equalizer circuit) by supplying voltage to the gate electrode of the transistor (e.g., PMOS transistor) of the equalizer circuit. During the read and write operations, the method 700 can include configuring or maintaining the equalizer circuit in the second state. During a time period between the read and write operations, the method 700 can include configuring the equalizer circuit in the first state (e.g., activating the equalizer circuit) by suspending the supply of voltage to the gate electrode of the transistor of the equalizer circuit, thereby allowing the equalizer circuit to equalize the voltage between access lines (e.g., between bit line BL and bit line BLB), thereby minimizing the NBTI impact of the first pre-charge circuit in scenarios of extended standby phase of the memory array, for example.

In one aspect of the present disclosure, a memory circuit is disclosed. The memory circuit includes a memory array comprising a plurality of memory cells. The memory circuit includes a first pre-charge circuit coupled to at least one access line electrically connected to the plurality of memory cells and configured to be in a first state during a standby mode of the memory array. The memory circuit includes a second pre-charge circuit coupled to the at least one access line and configured to be in a second state during the standby mode.

In another aspect of the present disclosure, a memory circuit is disclosed. The memory circuit includes a memory array comprising a plurality of memory cells. The memory circuit includes a pre-charge circuit coupled to a first access line and a second access line electrically connected to the plurality of memory cells and configured to be in a low state during a standby mode of the memory array. The memory circuit includes an equalizer circuit coupled to the first access line and the second access line and configured to be in a high state during the standby mode.

In yet another aspect of the present disclosure, a method for operating a memory device is disclosed. The method includes activating a first pre-charge circuit, coupled to at least one access line electrically connected to a plurality of memory cells of a memory array, during a standby mode of the memory array, wherein activating the first pre-charge circuit charges the at least one access line to a supply voltage. The method includes deactivating a second pre-charge circuit, coupled to the at least one access line, during the standby mode of the memory array, wherein deactivating the second pre-charge circuit suspends charging the at least one access line.

As used herein, the terms "about" and "approximately" generally indicate the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

I foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a memory array comprising a plurality of memory cells;
a first pre-charge circuit coupled to at least one access line electrically connected to the plurality of memory cells, and configured to be in a first state during a standby mode of the memory array;
a second pre-charge circuit coupled to the at least one access line, and configured to be in a second state during the standby mode; and
at least one word line coupled to the plurality of memory cells, and configured to be charged to a supply voltage during a read operation or a write operation of the plurality of memory cells for respective predefined first time periods,
wherein the first pre-charge circuit is in the second state to suspend charging the at least one access line during the read operation and the write operation for predefined second time periods associated with the respective predefined first time periods.

2. The memory circuit of claim 1, wherein the second state is indicative of an inactive pre-charge circuit to suspend charging the at least one access line and the first state is indicative of an active pre-charge circuit to charge the at least one access line to a supply voltage, and wherein in the first state during the standby mode, the first pre-charge circuit is configured to charge the at least one access line to the supply voltage prior to accessing the plurality of memory cells.

3. The memory circuit of claim 1, wherein the standby mode is associated with a time period when an access operation is suspended.

4. The memory circuit of claim 1, wherein:
the first pre-charge circuit is configured to be in the second state to suspend charging the at least one access line during the read operation and the write operation of the plurality of memory cells; and
the second pre-charge circuit remains in the second state during the read operation and the write operation.

5. The memory circuit of claim 4, wherein the read operation and the write operation of the plurality of memory cells correspond to an access operation performed in one clock cycle.

6. The memory circuit of claim 4, wherein the first pre-charge circuit and the second pre-charge circuit are in the first state during a predefined time period between the read operation and the write operation to charge the at least one access line.

7. The memory circuit of claim 1, wherein the at least one access line discharges during the read operation of the plurality of memory cells, wherein the at least one access line recharges after the read operation, when the first pre-charge circuit and the second pre-charge circuit are in the first state, and wherein a time period of recharging the at least one access line is predetermined.

8. The memory circuit of claim 7, wherein the at least one word line is charged to the supply voltage for the write operation at a time instance when the first pre-charge circuit and the second pre-charge circuit are in the second state.

9. The memory circuit of claim 1, wherein one or more of the plurality of memory cells correspond to a pseudo-dual-port (PDP) static random access memory (SRAM), wherein the PDP SRAM is configured to performing the read operation and the write operation within one clock cycle.

10. The memory circuit of claim 1, wherein:
the at least one access line comprises a first access line and a second access line;
the first pre-charge circuit comprises:
a first transistor operatively coupled to the first access line,
a second transistor operatively coupled to the second access line, and
a third transistor operatively coupled to the first access line and the second access line, and configured to equalize charges of the first access line and the second access line, wherein respective gates of the first, second, and third transistors are operatively coupled; and
the second pre-charge circuit comprises:
a fourth transistor operatively coupled to the first access line,
a fifth transistor operatively coupled to the second access line, and
a sixth transistor operatively coupled to the first access line and the second access line, and configured to equalize charges of the first access line and the second access line, wherein respective gates of the fourth, fifth, and sixth transistors are operatively coupled.

11. A memory circuit, comprising:
a memory array comprising a plurality of memory cells;
a pre-charge circuit coupled to a first access line and a second access line electrically connected to the plurality of memory cells, and configured to be in a low state during a standby mode of the memory array;
an equalizer circuit coupled to the first access line and the second access line, and configured to be in a high state during the standby mode; and at least one word line coupled to the plurality of memory cells, and configured to be charged to a supply voltage during a read operation or a write operation of the plurality of memory cells for respective predefined first time periods, wherein during the read operation and the write operation, the pre-charge circuit is in the high state to suspend charging the first access line and the second access line for predefined second time periods associated with the respective predefined first time periods.

12. The memory circuit of claim 11, wherein the high state is indicative of an inactive pre-charge circuit to suspend charging the first access line and the second access line or an inactive equalizer circuit to suspend equalizing charges of the first access line and the second access line, and the low state is indicative of an active pre-charge circuit to charge the first access line and the second access line to a supply voltage or an active equalizer circuit to equalize charges of the first access line and the second access line, and wherein in the low state during the standby mode, the pre-charge circuit is configured to charge the first access line and the second access line to the supply voltage prior to accessing the plurality of memory cells.

13. The memory circuit of claim 11, wherein:

the pre-charge circuit is configured to be in the high state to suspend charging at least one of the first access line or the second access line during the read operation and the write operation of the plurality of memory cells;

the equalizer circuit remains in the high state during the read operation and the write operation to suspend equalizing a first charge of the first access line to a second charge of the second access line; and the pre-charge circuit and the equalizer circuit are in the low state between the read operation and the write operation, wherein in the low state, the pre-charge circuit is configured to charge the first access line and the second access line to a supply voltage and the equalizer circuit is configured to equalize the first charge of the first access line to the second charge of the second access line.

14. The memory circuit of claim 13, wherein the read operation and the write operation of the plurality of memory cells are performed in one clock cycle.

15. The memory circuit of claim 13, wherein a respective time period of at least one of the read operation, the write operation, the high state of the pre-charge circuit, the low state of the pre-charge circuit and the equalizer circuit between the read operation and the write operation, or between the read operation and the write operation is predefined.

16. The memory circuit of claim 11, wherein:

the pre-charge circuit comprises:

a first transistor operatively coupled to the first access line, a second transistor operatively coupled to the second access line, and a third transistor operatively coupled to the first access line and the second access line, and configured to equalize the first access line and the second access line, wherein respective gates of the first, second, and third transistors are operatively coupled; and the equalizer circuit comprises:

a fourth transistor operatively coupled to the first access line and the second access line, and configured to equalize charges of the first access line and the second access line.

17. A method, comprising:

activating a first pre-charge circuit, coupled to at least one access line electrically connected to a plurality of memory cells of a memory array, during a standby mode of the memory array, wherein activating the first pre-charge circuit charges the at least one access line to a supply voltage;

deactivating a second pre-charge circuit, coupled to the at least one access line, during the standby mode of the memory array, wherein deactivating the second pre-charge circuit suspends charging the at least one access line;

charging at least one word line coupled to the plurality of memory cells to a supply voltage during a read operation or a write operation of the plurality of memory cells for respective predefined first time periods; and deactivating, during the read operation and the write operation, the first pre-charge circuit to suspend charging the at least one access line for predefined second time periods associated with the respective predefined first time periods.

18. The method of claim 17, further comprising:

deactivating the first pre-charge circuit during the read operation or the write operation of the memory array; and deactivating the second pre-charge circuit during the read operation or the write operation of the memory array.

19. The method of claim 17, further comprising:

activating the first pre-charge circuit and the second pre-charge circuit during the standby mode of the memory array associated with a time period between the read operation and the write operation.

20. The memory circuit of claim 11, wherein one or more of the plurality of memory cells correspond to a pseudo-dual-port (PDP) static random access memory (SRAM), wherein the PDP SRAM is configured to performing the read operation and the write operation within one clock cycle.

* * * * *